(12) United States Patent
Batten et al.

(10) Patent No.: US 7,170,296 B2
(45) Date of Patent: Jan. 30, 2007

(54) LOOP IMPEDANCE METER

(75) Inventors: Douglas William Batten, Watford (GB); Martin Ian Gordon, Watford (GB)

(73) Assignee: Martindale Electric Co. Ltd, Hertfordshire (GB)

( * ) Notice: Subject to any disclaimer, the term of this patent is extended or adjusted under 35 U.S.C. 154(b) by 0 days.

(21) Appl. No.: 10/493,508

(22) PCT Filed: Oct. 24, 2002

(86) PCT No.: PCT/GB02/04797

§ 371 (c)(1),
(2), (4) Date: Nov. 9, 2005

(87) PCT Pub. No.: WO03/036315

PCT Pub. Date: May 1, 2003

(65) Prior Publication Data

US 2006/0071675 A1    Apr. 6, 2006

(30) Foreign Application Priority Data

Oct. 24, 2001    (GB)    ................................. 0125519.9

(51) Int. Cl.
*G01R 31/08* (2006.01)
*G01R 27/08* (2006.01)
(52) U.S. Cl. ...................................... 324/527; 324/710
(58) Field of Classification Search ................. 324/527, 324/710
See application file for complete search history.

(56) References Cited

U.S. PATENT DOCUMENTS 4,761,812 A * 8/1988 Hollis et al. ................. 379/413

6,271,668 B1    8/2001 Sehdev et al.
6,288,553 B1    9/2001 Hofstetter et al.

FOREIGN PATENT DOCUMENTS

| EP | 0881500 A1 | 12/1998 |
|---|---|---|
| GB | 833339 | 4/1960 |
| GB | 2292225 A | 2/1996 |
| GB | 2343005 A | 4/2000 |
| WO | WO 9501573 A1 | 1/1995 |

* cited by examiner

*Primary Examiner*—Andrew H. Hirshfeld
*Assistant Examiner*—Amy He
(74) *Attorney, Agent, or Firm*—Stetina Brunda Garred & Brucker (57) ABSTRACT

A loop impedance meter for testing an A.C. electrical mains supply, including an electronic control circuit for connecting a load resistance intermittently between the A.C. mains supply terminal and the earth terminal to measure the potential difference between those terminals and to provide an indication of the loop impedance of the A.C. mains supply from that potential difference, wherein the control circuit is arranged to allow a train of short pulses of current to flow through the load resistance and the loop, the pulse train beginning its sequence with a first train of pulses for preconditioning any residual circuit device (RCD) present in the loop to temporarily desensitize it, wherein the first train of pulses is followed by one or more measurement pulses, the pulses of the first train being of generally increasing width.

22 Claims, 7 Drawing Sheets

Figure 7

LOOP IMPEDANCE METER

BACKGROUND OF THE INVENTION

This invention relates to a loop impedance meter for testing alternating current (A.C.) electrical mains supplies; and to a method of using it.

Loop impedance meters are used to measure the impedance of the phase-earth circuit. This is done to ensure that, under a fault condition, the resultant current will be large enough to trip the circuit breaker or to blow the supply fuse. Many modern installations have an additional safety device known as a residual current device (RCD). RCDs effectively compare the current flowing in the phase and neutral circuits, and, if the current to earth should exceed a preset value, disconnect the supply. The phase-earth loop impedance measurement inherently has a current flow from phase to earth and hence the phase and neutral currents cannot be balanced. The problem here is that conventional loop impedance meters for measuring the phase-earth loop impedance tend to trip the RCD, which puts the supply out of service until the RCD can be reset. This prevents any repeat of the loop impedance measurement until the RCD has been reset, and it is also generally inconvenient.

Most conventional loop impedance meters connect a load resistor of about 10 ohms from phase to earth and measure the voltage between these connections both under load and without load. This measurement is usually made over one or more mains cycle; for 50 Hz mains frequency, the period between cycles is 20 milliseconds, and the measurement is typically made over 20 to 40 milliseconds. The load current that flows is typically about 25 amps. The loop impedance is typically up to about 1 ohm, and clearly a 1 ohm loop impedance would result in a change in voltage from no load to load of about 25 volts, at a nominal mains voltage of 230 volts r.m.s. This very large earth current for this length of time will trip the RCDs in the circuit, which is very inconvenient when checking the wiring and which interferes with equipment already in use.

Some loop impedance meters use short pulses of large current, typically about 25 amps with a pulse length of about 5 microseconds. These short pulses usually do not trip any RCD in the circuit, but the large currents result in large signals to be measured. In one example, the loop impedance meter applies a large step voltage to the phase-earth loop and measures the resultant current. The voltage step is typically about 80 volts lasting for a few microseconds. All these short pulse loop impedance meters suffer from gross inaccuracy due to the inductive component in the wiring of the mains circuit, which can be substantial and unpredictable.

By way of illustration, inductance values from 100 to 600 µH have commonly been observed, and occasionally even larger values have been observed. The time constant of a circuit of inductance L and resistance R is L/R seconds, and in a typical earth-phase measurement circuit the resistance load is 10 ohms. Since the wiring resistance is usually 1 ohm or less, the circuit resistance can be approximated to 10 ohms. Thus if the inductance is 10 µH, the time constant is 1 microsecond and the time taken to settle to within a 1% error for measurement is 5 time constants, or 5 microseconds. This would usually be acceptable, as 5 microseconds would not be sufficiently long to trip the RCD even with a current of 25 amps. However, with larger values of inductance, the time increases proportionately, and a value of inductance of 100 µH would require a settling time of 50 microseconds which could easily cause the RCD to trip.

SUMMARY OF THE INVENTION

In order to reduce the risk of an RCD tripping, the invention accordingly provides a loop impedance meter for testing A.C. electrical mains supplies, comprising, an electronic control circuit for connecting a load resistance intermittently between the A.C. mains supply terminal and the earth terminal to measure the potential difference between those terminals and to provide an indication of the loop impedance of the A.C. mains supply from that potential difference, wherein the value of the load resistance measured in ohms is in the range of one sixth to one twice the value of the r.m.s. mains voltage rating of the meter measured in volts, so as to deliver about ½ A to 6 A intermittent current flow. By way of an example to illustrate and clarify this, in the case of a nominal 230 V supply the load resistance is in the range of 40 ohms to 480 ohms. It will be appreciated that a similar approach may be taken on other voltage supplies, such as a 110 V supply.

By increasing the load resistance, the time constant of the circuit is decreased. Further, the test current is also decreased, and we have observed that typical conventional RCDs can tolerate levels of current flow in inverse proportion to the duration of the current pulse. Typically, an RCD can take the current from a 330 ohm resistor on a nominal 230 volt supply, for 60 microseconds or longer.

Thus the invention works by both reducing the settling time and reducing the current, both of which have a linear effect on susceptibility to tripping in an RCD. Accordingly, the benefit is a square function of the load resistance.

With a value of resistance of 100 ohms, an inductance of 100 µH in the circuit would still only lead to a settling time of 5 microseconds, and the current could typically be 2.5 amps, so most RCDs would not trip under these conditions. In the example of a typical RCD, the use of a 100 ohm resistor on a nominal 230 volts supply would still not cause it to trip even in the presence of an inductance of 1000 µH, whilst still giving accuracy to within 1%.

A further problem we have noticed with typical RCDs is that they are very sensitive to narrow spikes, and indeed many modern devices have built in filters to remove this sensitivity as it leads to nuisance tripping, which is very inconvenient to end users. In order to reduce this sensitivity to narrow spikes, whilst being able to take accurate measurements in a reasonably short time, we have developed the further invention which provides a loop impedance meter for testing AC. electrical mains supplies, comprising an electronic control circuit for connecting a load resistance intermittently between the A.C. mains supply terminal and the earth terminal to measure the potential difference between those terminals and to provide an indication of the loop impedance of the A.C. mains supply from that potential difference, wherein the control circuit is arranged to allow a train of short pulses of current flow through the load resistance and the loop, the pulse train beginning its sequence with a first train of pulses for preconditioning any RCD present in the loop to temporarily desensitise it to one or more measurement pulses which then follow, the pulses of the first train being of generally increasing width.

It is not yet fully understood how the preconditioning sequence, with pulses of generally increasing width, serves to temporarily desensitise most RCDs, and for the present this is treated as a useful empirical result.

Preferred features of the preconditioning pulses are described below.

A related invention is a method of measuring the phase-to-earth loop impedance of an A.C. mains supply, comprising connecting a loop impedance meter according to the invention across the supply and observing the indication of the loop impedance.

Further in accordance with this invention, apparatus for measuring the loop impedance of an A.C. electrical mains supply and for protecting loads on that supply from excessive current, comprises an RCD and a loop impedance meter according to the invention, configured to minimise the risk of inadvertent tripping of the RCD whilst in use.

A further problem with conventional loop impedance testers is related to the fact that mains supply circuits are a very complex interconnection of wires and loads. Each load can have resistive, inductive and capacitive components. Each section of wire has its own resistive, inductive and capacitive elements, which can be lumped or distributed along the wiring. The resultant behaviour of the mains supply circuit when measured from a connection at some place in this sea of connections and components will present a complex behaviour to a pulsed measurement. This behaviour may be time dependent as loads are connected or disconnected from the supply. Clearly it is desired to measure the low frequency characteristic of the network, rather than any high frequency components. The safety of the system is due to fuses and circuit breakers which respond to the low frequency currents rather than high frequency perturbations.

The use of short pulses in a loop impedance meter involves potential errors because of these high frequency perturbations. The perturbations typically affect short and medium pulses, i.e. those of the order of 5 to 100 microseconds width. The effects of these errors can be reduced or eliminated by making a series of measurements at different pulse widths and producing a calculated resistive measurement by fitting the results to a predetermined curve, or by using some other form of extrapolation. The effective impedance at mains frequency, typically 50 Hz, is thus calculable. This effectively removes the high frequency perturbation error.

Accordingly, a further invention provides a loop impedance meter for testing A.C. electrical mains supplies, comprising an electronic control circuit for connecting a load resistance intermittently between the A.C. mains supply terminal and the earth terminal to measure the potential difference between those terminals and to provide an indication of the loop impedance of the A.C. mains supply from that potential difference, wherein the control circuit is arranged to allow a train of short pulses of current flow through the load resistance and the loop, the pulse train comprising measurement pulses of a range of different widths all less than one millisecond, the control means being arranged to extrapolate the impedance measurements to provide an indication of the effective impedance at the A.C. mains supply frequency.

Another problem encountered during testing of AC mains supplies at various sites is ring that is generated after the pulse rise of the measurement pulse. This gives false readings of the voltage drop caused by the switching in of the load resistor R1 as the voltage at the top of the pulse can be swamped by this ring, and the true measurement is somewhere within the ring. The magnitude, frequency and decay of the ring appear to be dependent on the varying complex components of the AC mains supplies at individual sites.

Accordingly another invention provides a loop impedance meter for testing A.C. electrical mains supplies, comprising an electronic control circuit for connecting a load resistance intermittently between the A.C. mains supply terminal and the earth terminal to measure the potential difference between those terminals and to provide an indication of the loop impedance of the A.C. mains supply from that potential difference, wherein the control circuit is arranged to allow a train of short pulses of current flow through the load resistance and the loop, the pulse train beginning its sequence with a first train of pulses for preconditioning any RCD present in the loop to temporarily desensitise it to one or more measurement pulses which then follow, and the electronic control circuit is arranged to take reference measurements before, during and after at least one measurement pulse to calculate a compensation for ring generated on each measurement pulse.

Preferred features of the measurement pulse train are described below.

BRIEF DESCRIPTION OF THE DRAWINGS

In order that the inventions may be better understood, preferred embodiments will now be described, by way of example only, with reference to the accompanying drawings, in which.

DETAILED DESCRIPTION OF THE INVENTION

Figure 1:
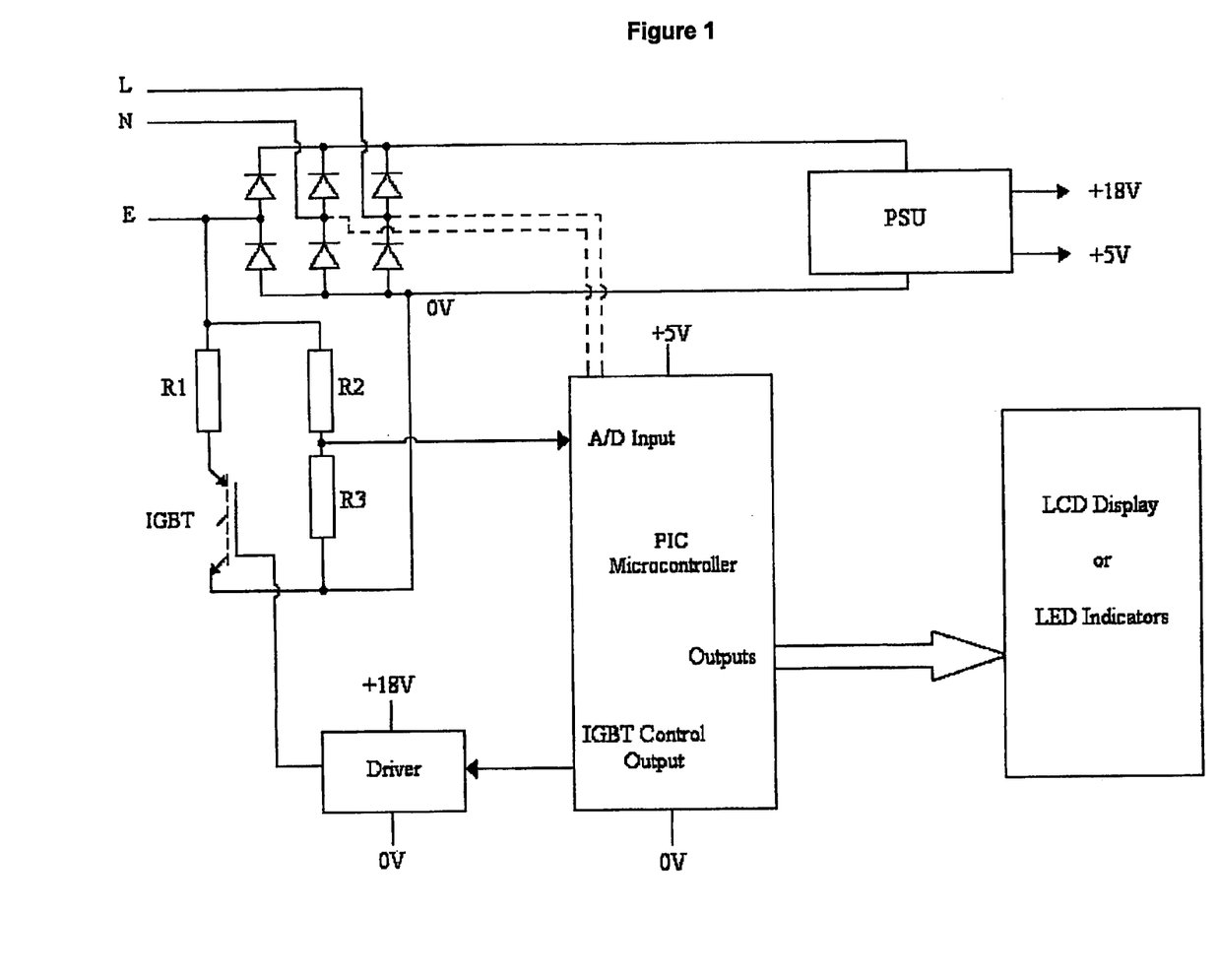
FIG. 1 is a simplified block circuit diagram of a loop impedance meter embodying the invention.

A loop impedance meter whose schematic circuit diagram is shown in FIG. 1 comprises a housing connectable to a typical A.C. mains supply, and a display for providing an indication of loop impedance. In a first example, for use typically by a non-specialist, the housing has pins for insertion into a typical mains socket, and a display comprising an array of light emitting diodes (LEDs). In a preferred embodiment, there are three indicators which each glow either green or red, the combined display indicating the impedance in one of six ranges. In this example, the ranges are 0 to 1.7 ohms; 1.7 to 5 ohms; 5 to 10 ohms; 10 to 50 ohms; 50 to 100 ohms and 100 to 500 ohms.

In an alternative embodiment of the invention, the housing instead has a liquid crystal display (LCD) giving a numerical readout of impedance. In another embodiment of the invention, Instead of using pins for insertion into a mains socket, adaptors and crocodile clips are provided instead.

In each case, there is preferably also an indication of whether the wiring is correct, i.e. whether the live, neutral and earth wires have been incorrectly connected somewhere in the installation. This wiring check is conventional, and will not be described here, save to say that the result of the wiring test is displayed either on the LCD display or else in a separate array of LEDs.

The three mains connections for phase (L), neutral (N) and earth (E) are fed into a six diode full wave rectifier circuit as shown in FIG. 1, providing a peak DC voltage of about 350 V, without filtering. A power supply unit (PSU) connected across this rectifier circuit provides an 18 V supply to a driver circuit for providing pulses to an insulated gate bipolar transistor (IGBT) and a 5 V supply to a microprocessor or programmable integrated circuit (PIC) for providing overall control of the meter. Outputs from the PIC drive the LCD display or the LED indicator display, as appropriate, to provide a visual indication of the effective loop impedance. The IGBT is of the type often used in switched mode power supplies, and in this case it is connected between a load resistance R1 typically of 200 or 330 ohms and the ground line of the rectifier circuit. The other end of the load resistance R1 is connected to the earth connection (E), which is also connected across a voltage divider consisting of resistors R2 and R3. The PIC is connected via voltage dividers (not shown) into the phase (L) and neutral (N) lines in the rectifier circuit, and also to the mid point of the voltage divider R2, R3 to measure $\frac{1}{80}$ of the voltage across the load resistor R1 and IGBT. These connections are made through an analogue to digital input within the PIC.

The IGBT is used to switch the load between earth and phase. The IGBT is selected for this purpose because its "on" voltage is controllable within tight limits, and such devices are available with high voltage ratings, up to 600 V; they are also rated for reverse avalanche energy, which is required because inductive circuits can generate a large voltage spike.

The addition of an extra measuring circuit, with an extra IGBT, could similarly allow phase neutral measurements to be taken and thereby produce a calculated PSC (prospective short circuit current) value.

The PIC or microprocessor includes a ceramic 2 MHz resonator, although other frequency resonators or crystals may be used.

The loop impedance is determined by measuring the potential difference between phase (L) and earth (E), whilst unloaded, and then by closing the IGBT to load the circuit with the 330 ohm resistance and measuring the loaded voltage. The impedance is calculated from these two voltage measurements using Ohm's law.

Figure 2:
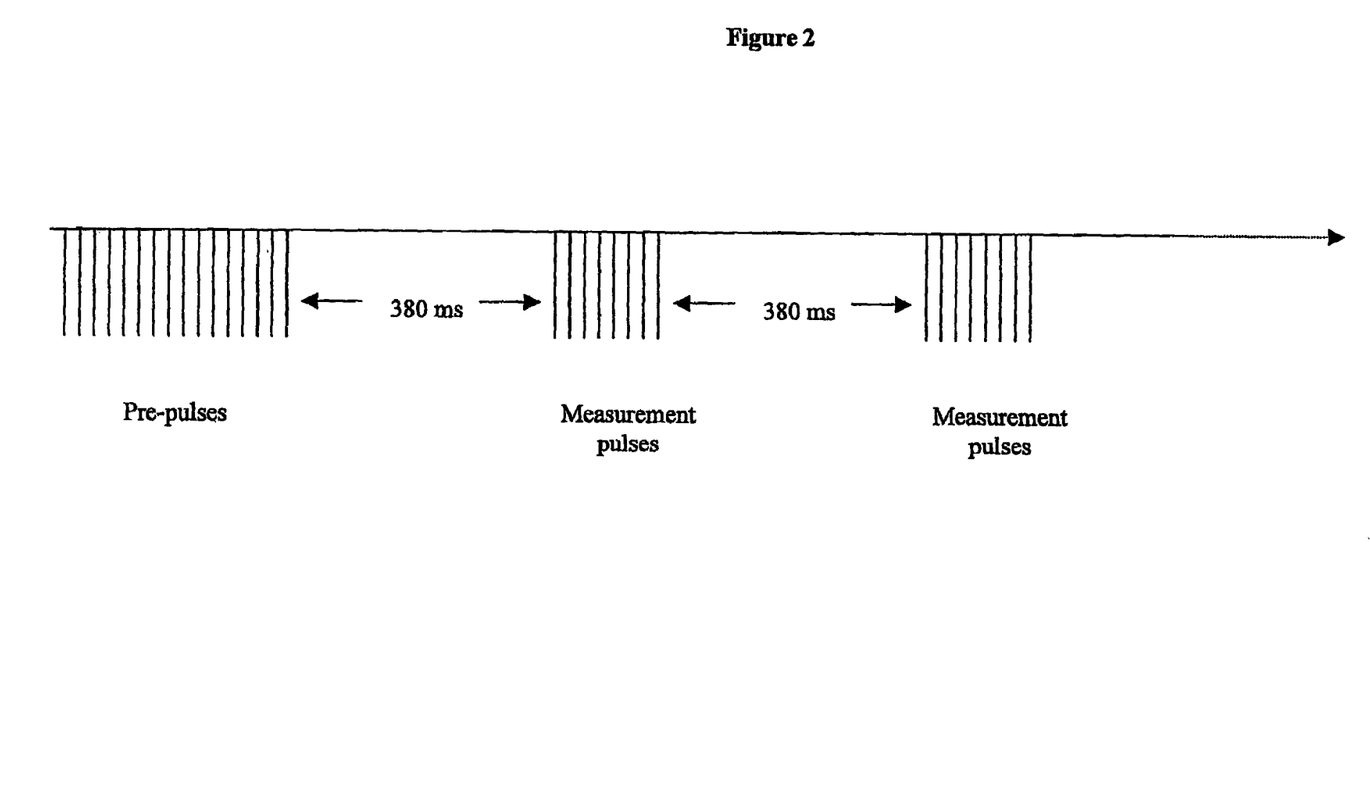
FIG. 2 is a pulse train diagram in accordance with an embodiment of the invention.

In one example, shown in FIG. 2, the microprocessor PIC causes the driver to deliver the pulse sequence shown to the IGBT. A first train of pulses, called pre-pulses in FIG. 2, consists of voltage pulses of 4, 8, 12, 16, 20, 24, 28, 32, 36, 40, 44, 48, 52, 56 and 60 microseconds, in that order, at intervals of 20 milliseconds which coincide with negative-going mains peaks. Thus the pulse widths are steadily increasing, with equal increments of 4 microseconds. This is intended to pre-condition any RCD in the mains circuit, so that it will not trip with the subsequent measurement pulses. The measurement pulses are delivered in groups of 8, and are each of 60 microseconds width at 20 millisecond intervals, coinciding with negative-going mains peaks. Each group of 8 such pulses is separated by 380 milliseconds delay. However, in order to avoid overheating in the housing from the current flowing through the load resistance R1, the interval between measurement pulse groups is increased, after about two minutes, to approximately 5.4 seconds.

During the 380 millisecond interval between pulse groups, the device repeats the sequence of wiring and voltage checks that would have been performed at power up, and if it detects a failure in those wiring or voltage checks then the loop measurements are not performed.

For each group of 8 measurement pulses, the microprocessor computes the voltage ratio to provide the loop impedance and then averages those 8 ratio determinations over the 8 pulses. It is this average value which determines the indication given visually. It is then updated with the average value for the next group of 8.

Alternatively, for each group of 8 measurement pulses, the microprocessor averages the measured voltages and computes the voltage ratio to provide the loop impedance and then averages those 8 ratio determinations over the 8 pulses. It is this value which determines the indication given visually. It is then updated with the value for the next group of 8.

Figure 3:
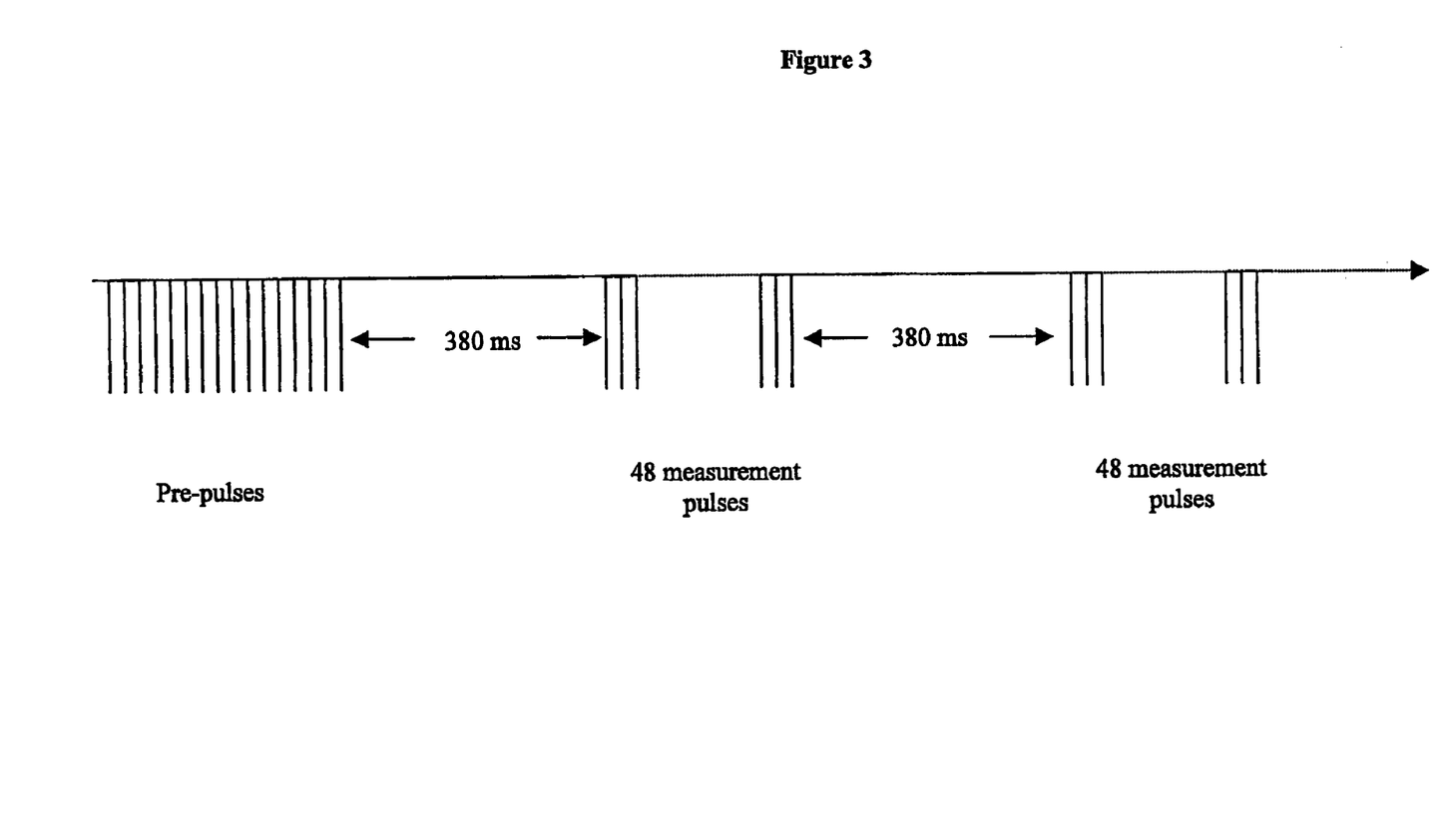
FIG. 3 is an alternative form of pulse train diagram in accordance with another embodiment of the invention.

An alternative form of pulse sequence is shown in FIG. 3. The same pre-pulse width sequence is used, from 4 to 60 microseconds, except that in this case they are delivered at intervals of 40 milliseconds, to coincide with every other negative going mains peak. This can improve the preconditioning effect on some RCDs, at the expense of a slight delay in the delivery of the impedance measurement.

The measurement pulses may be provided in groups of 48 pulses, comprising 3 different pulse widths repeated 16 times. By way of an example, such a sequence may be 20, 25, 60; 20, 25, 60; . . . microseconds and so on. The pulses will again be at intervals of 40 milliseconds to coincide with every other negative going mains peak. The microprocessor is programmed with a formula for extrapolating from each group of three measurements of impedance, to determine the mains frequency (50 Hz) equivalent loop impedance value; and the 16 results are then averaged to provide the value for display.

Figure 4:
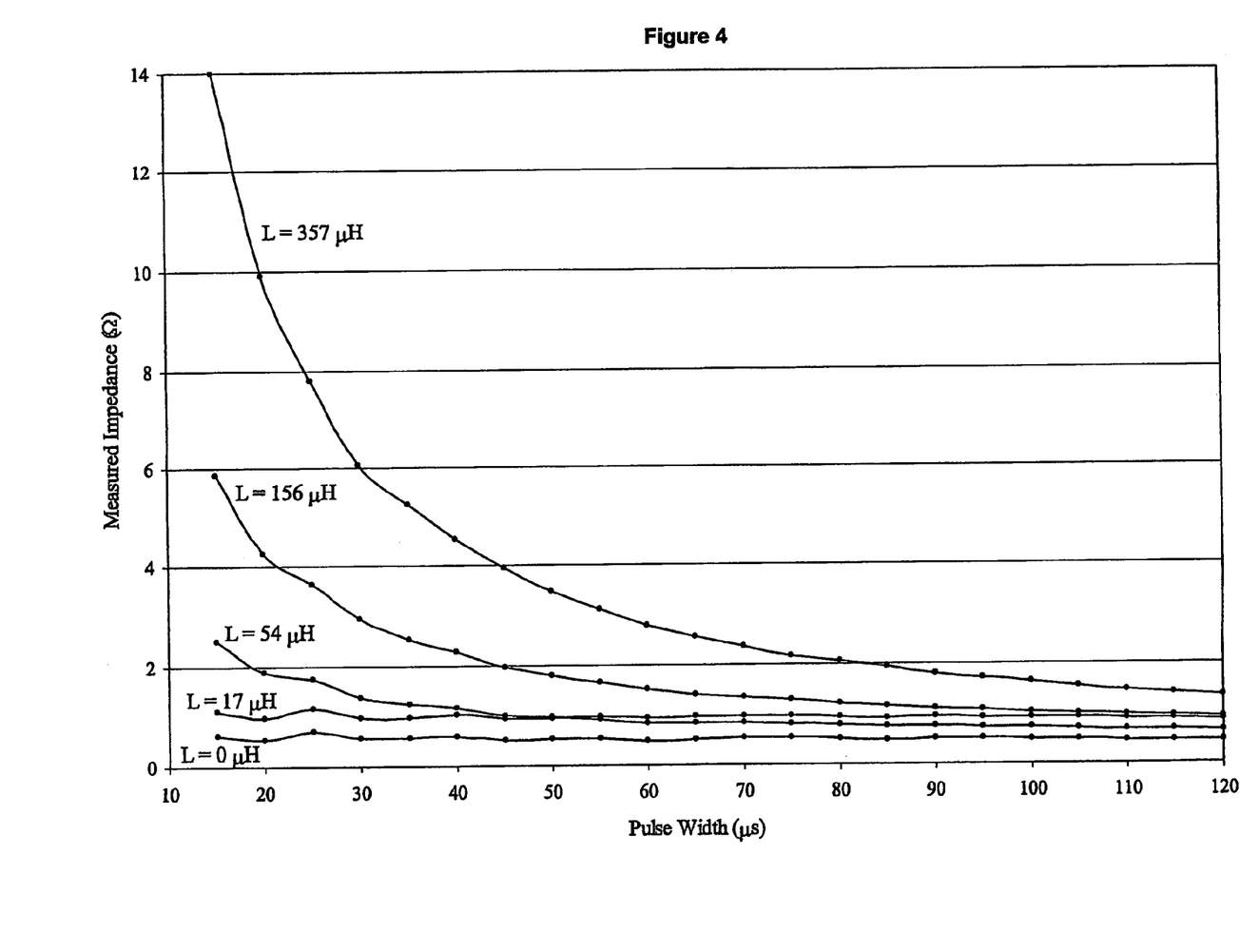
FIG. 4 is a graph indicating test results taken from Table 1 below, showing the measured impedance, from a loop impedance meter embodying the invention, for different pulse widths and different loop inductances.
Figure 5:
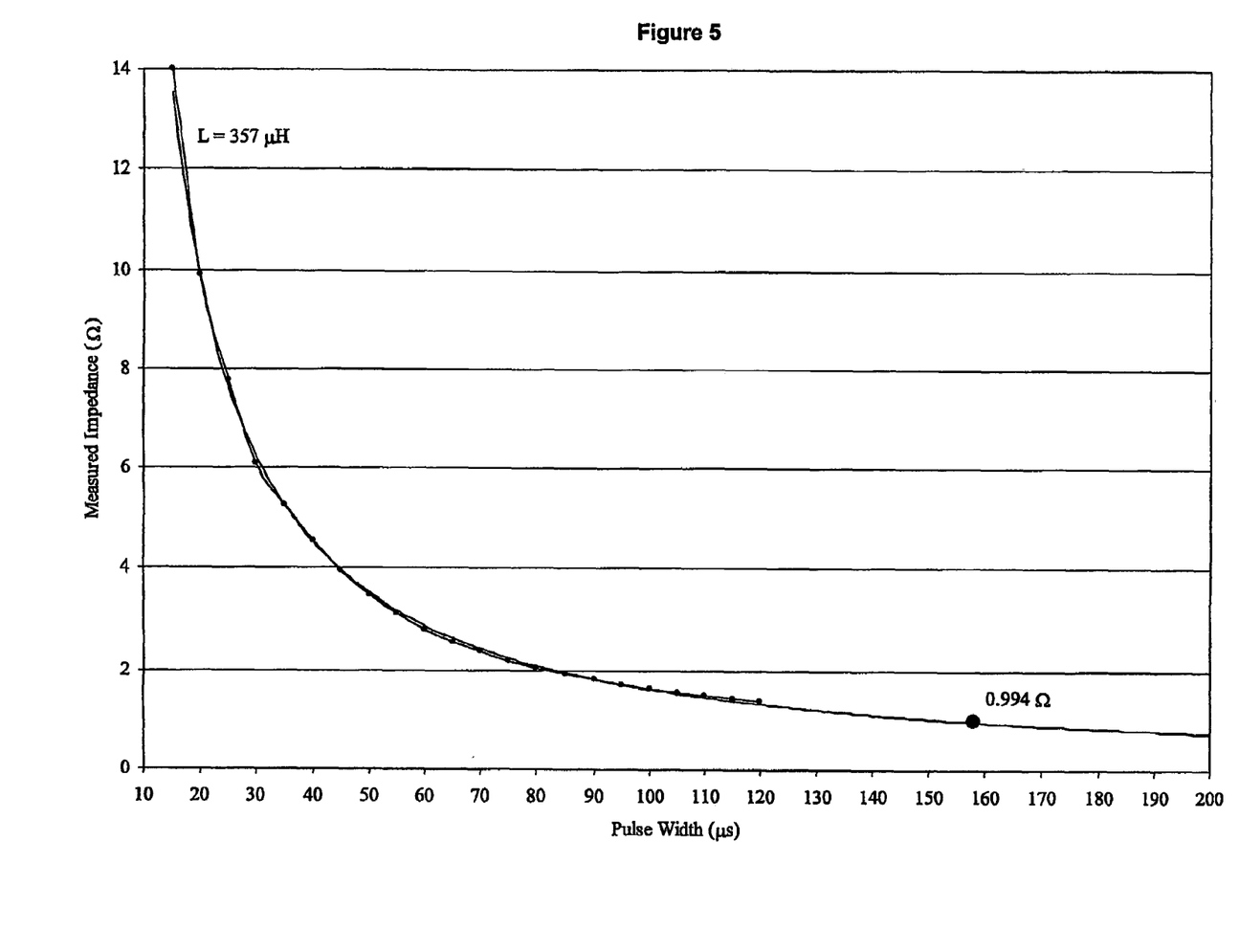
FIG. 5 is a graph showing the impedance measurements taken with a loop inductance of 357 μH and given in the bottom line of Table 1 below.

The extrapolation procedure, for deriving an effective loop impedance value for mains frequency, from computed values at much higher equivalent frequencies, i.e. at short pulse widths, is illustrated in FIGS. 4 and 5 with reference to Table 1 below, which shows test measurements on a circuit similar to that of FIG. 1.

TABLE 1

| Added L µH | R loop Ω | Pulse width (microseconds) | | | | | | | | | | |
| --- | --- | --- | --- | --- | --- | --- | --- | --- | --- | --- | --- | --- |
| | | 15 | 20 | 25 | 30 | 35 | 40 | 45 | 50 | 55 | 60 | 65 |
| 0 | 0.458 | 0.623 | 0.526 | 0.697 | 0.548 | 0.549 | 0.581 | 0.493 | 0.516 | 0.527 | 0.481 | 0.506 |
| 17 | 0.876 | 1.113 | 0.984 | 1.156 | 0.985 | 0.982 | 1.033 | 0.940 | 0.959 | 0.979 | 0.944 | 0.965 |
| 54 | 0.659 | 2.493 | 1.887 | 1.753 | 1.401 | 1.239 | 1.166 | 0.992 | 0.965 | 0.924 | 0.847 | 0.836 |

TABLE 1-continued

| | | | | | | | | | | | |
|---|---|---|---|---|---|---|---|---|---|---|---|
| 156 | 0.801 | 5.878 | 4.263 | 3.642 | 2.957 | 2.539 | 2.274 | 1.973 | 1.810 | 1.679 | 1.530 | 1.429 |
| 357 | 0.994 | 13.994 | 9.910 | 7.780 | 6.076 | 5.267 | 4.543 | 3.943 | 3.489 | 3.115 | 2.794 | 2.553 |

| Added L | R loop | Pulse width (microseconds) | | | | | | | | | |
|---|---|---|---|---|---|---|---|---|---|---|---|
| μH | Ω | 70 | 75 | 80 | 85 | 90 | 95 | 100 | 105 | 110 | 115 | 120 |
| 0 | 0.458 | 0.536 | 0.520 | 0.494 | 0.486 | 0.499 | 0.491 | 0.473 | 0.487 | 0.447 | 0.444 | 0.438 |
| 17 | 0.876 | 0.985 | 0.981 | 0.940 | 0.923 | 0.934 | 0.915 | 0.912 | 0.908 | 0.879 | 0.891 | 0.874 |
| 54 | 0.659 | 0.838 | 0.813 | 0.768 | 0.745 | 0.740 | 0.723 | 0.710 | 0.697 | 0.673 | 0.662 | 0.654 |
| 156 | 0.801 | 1.365 | 1.297 | 1.216 | 1.157 | 1.112 | 1.075 | 1.024 | 1.005 | 0.977 | 0.955 | 0.929 |
| 357 | 0.994 | 2.368 | 2.183 | 2.056 | 1.937 | 1.817 | 1.713 | 1.635 | 1.562 | 1.487 | 1.427 | 1.374 |

Table 1 shows measured loop impedance values in ohms, for each of several pulses whose widths vary from 15 to 120 microseconds. In each case, measurements were taken for five different values of inductance (L) added to the loop, from 0 to 357 μH, to simulate different installations. We appreciate that the R loop values would be expected to increase with inductance, but here this was not observed overall since the added inductances of 54, 156 and 357 μH had a higher Q-value than the 17 μH inductance.

For each loop inductance, the circuit was tested at 50 Hz using a conventional loop tester, and the results shown In the second column, in ohms.

These tabulated results for loop impedance are plotted in the five graphs shown in FIG. 4. The set of measurements for the largest inductance value, 357 μH, is shown in FIG. 5, together with an ideal curve generated by a predetermined formula in the microprocessor. Accurate measurements may be taken with pulse widths in the range of 120–200 μs. Typically such pulse widths will cause RCD tripping. Accordingly, the results of measurements at lower pulse widths, typically in the range 15 to 70 microseconds, can be extrapolated to calculate the expected results within the 120–200 μs range. This procedure produces results in agreement with values produced by conventional loop testers.

A problem encountered during testing of AC mains supplies at various sites is that of 'ring' that is generated after the pulse rise of the measurement pulse. This gives false readings of the voltage drop caused by the switching in of the load resistor R1 as the voltage at the top of the pulse can be swamped by this ring, and the true measurement is somewhere within the ring. The magnitude, frequency and decay of the ring appear to be dependent on the varying complex components of the AC mains supplies at individual sites.

In an alternative technique, once the pre-pulse sequence has finished the measurement pulses will be set to a nominal 55 μs width rather than the 25, 30 . . . 60 μs sequence of the previous technique. Measurement pulses are generated at 40 ms intervals to coincide with every other negative going mains peak as previously described. Before, during and after the first measurement pulse the PIC A/D via the R2/R3 divider will measure the voltage at the following nominal points:

1. 20 μs before the pulse
2. 25 μs after the pulse
3. 80 μs after the pulse
4. 135 μs after the pulse
5. 190 μs after the pulse For the 2$^{nd}$ to 7$^{th}$ pulses the voltage measurement points will then be incremented to the nominal positions given in Table 2:

TABLE 2

| Pulse No | Voltage measurement point | | | | |
|---|---|---|---|---|---|
| | 1 | 2 | 3 | 4 | 5 |
| 2 | 20 μs before | 30 μs after | 85 μs after | 140 μs after | 195 μs after |
| 3 | 20 μs before | 35 μs after | 90 μs after | 145 μs after | 200 μs after |
| 4 | 20 μs before | 40 μs after | 95 μs after | 150 μs after | 205 μs after |
| 5 | 20 μs before | 45 μs after | 100 μs after | 155 μs after | 210 μs after |
| 6 | 20 μs before | 50 μs after | 105 μs after | 160 μs after | 215 μs after |
| 7 | 20 μs before | 53 μs after | 108 μs after | 163 μs after | 218 μs after |

Note that the voltage measurement 1 stays at the same point for all pulses.

During the half cycles where the pulses are not fired, voltage measurements are made at exactly the same positions with respect to where the pulse would start if it were fired. This is to obtain further measurement data to be used in the calculations that cannot be obtained if the pulse is fired due to the ringing effects after the pulse. These are reference points used to determine the shape and slope at the bottom of the sine wave where the pulse is fired and to which the pulse measurement points can be referenced. In order to avoid 25 Hz phenomena, pauses are introduced to ensure variation of the relative position of reference and measurement cycles.

The above sequence is then repeated in sets of 7 pulses up to 100 or more times to obtain the measurements required to calculate a single displayed measurement of earth loop impedance.

Figure 6:
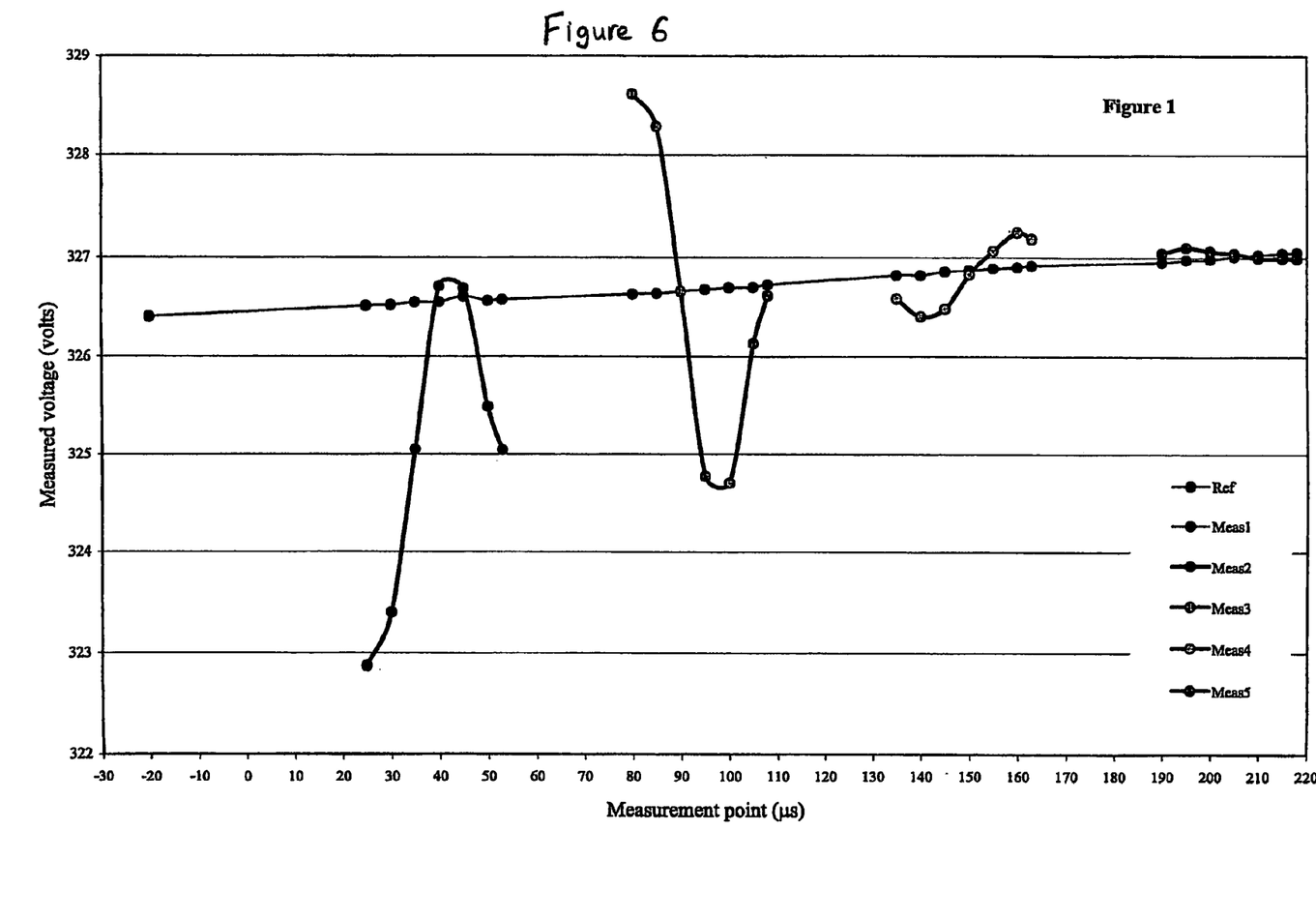
FIG. 6 is a graph showing voltage measurements taken at specific measurement points in time given in Table 2 by a loop impedance meter embodying the invention at a specific AC mains supplies site.
Figure 7:
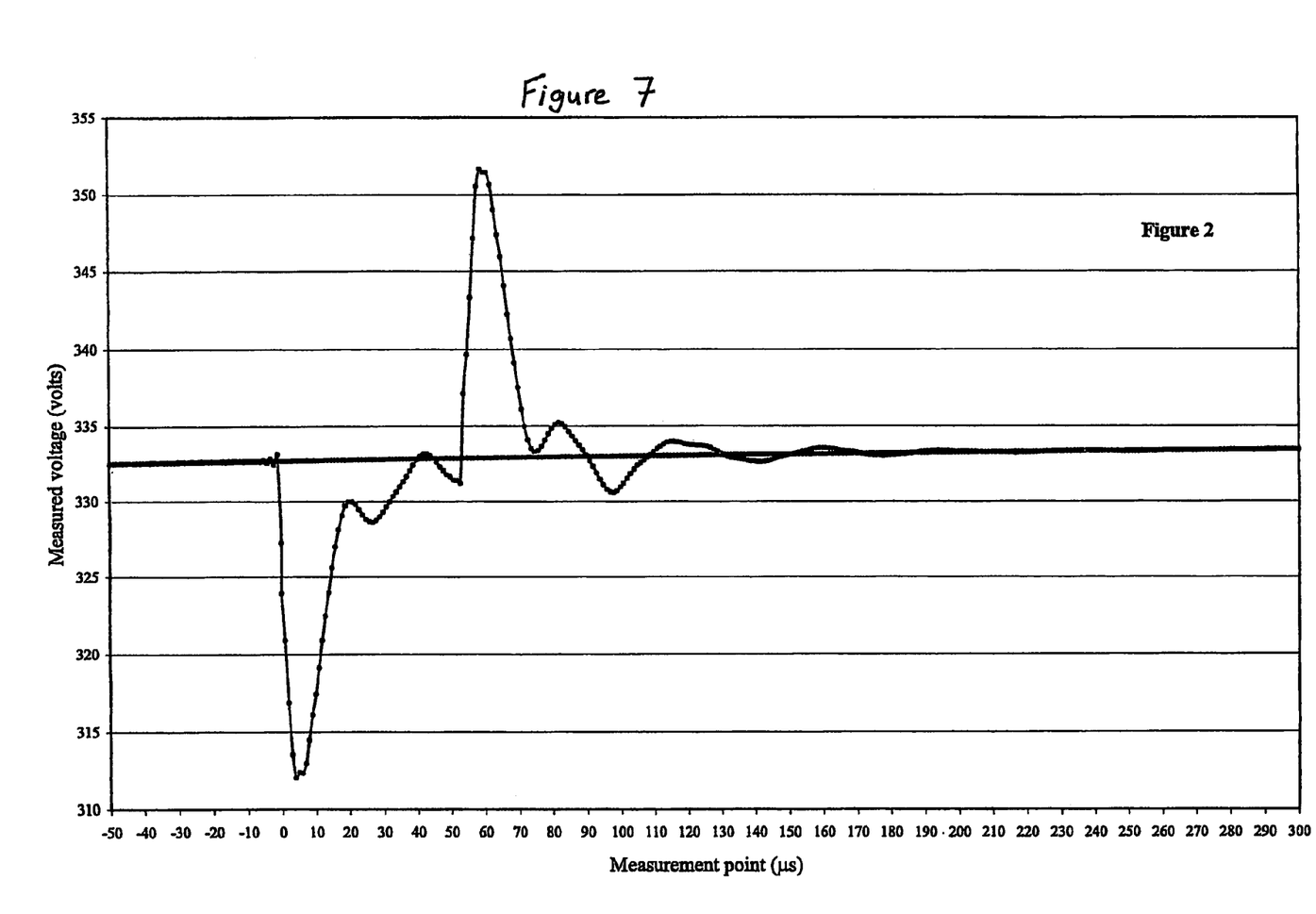
FIG. 7 is a graph showing voltage measurements taken at 1 μs intervals to illustrate the ring that is generated after the pulse rise, for the same AC mains supplies site as for FIG. 6.

It has been found through testing that at a great many sites the ring that is generated after the pulse rise is practically matched in shape and magnitude but inverted to the ring that is generated after the pulse has fallen, as illustrated in FIGS. 6 & 7. FIG. 6 shows voltage measurements at specific measurement points as given in Table 2 above, and FIG. 7 shows voltage measurements taken at 1 μs intervals.

By removing the difference in the reference point 3 and measurement point 3 from the measurement point 2 the ring can be compensated for and the true voltage drop at measurement point 2 found at the respective timing positions (e.g. 25 μs & 80 μs). In cases where the magnitude of the ring is relatively large and the decay relatively slow a substantial amount of the ring from the pulse rise carries on into the pulse fall ring. This can be compensated for by also removing the difference in the reference point 4 and measurement point 4 from the measurement point 2 (25 µs & 135 µs), and if necessary by also removing the difference in the reference point 5 and measurement point 5 from the measurement point 2 (25 µs & 190 µs).

With reference to FIG. 1, the above compensation technique is applied to the 30, 35, 40, 45, 50 & 53 µs measurement 2 point in turn.

It will be appreciated that the ring compensation technique described immediately above can also be used in conjunction with the method for measuring loop impedance described herein utilising a train of measurement pulses of gradually increasing width.

It will be appreciated that the various features of the meter, such as pre-pulse train, multiple groups of pulses, use of different pulse widths in a group to extrapolate to an effective impedance, averaging impedance results, and mains voltage, frequency and wiring testing, may be provided in different combinations to suit the requirements of the user. There are trade offs between speed of measurement, power consumption and the reduction of susceptibility to tripping RCDs; and also between cost and performance of the meter.

Whilst examples of the pulse widths and impedances of the load resistance have been given, many different values and ranges are possible.

Whilst the ideal value of load resistance should be about 330 ohms in the case of 230 volts nominal mains voltage, so as to deliver approximately 1 amp, ranges of about 60 to 120 ohms, or about 40 to 480 ohms, are also considered viable. Whilst the measurement pulse width is preferably less than a millisecond, it should preferably also be greater than 15 microseconds and preferably also less than 200 microseconds, still better less than 100 microseconds, for practicability and avoiding RCD tripping. Other possible ranges are from 15 microseconds to 200 microseconds or from 20 microseconds to 100 microseconds. The preconditioning pulses or pre-pulses are also preferably less than 100 microseconds in width and are preferably greater than 1 microsecond in width. Whilst their width preferably increases steadily with roughly equal increments, this is not essential, and they could increase stepwise, or change in some other fashion, provided the width increases overall from beginning to end. The increment of pulse width from pulse to pulse could be from 1 to 10 microseconds, preferably 2 to 6 microseconds and ideally about 4 microseconds. The pulse separation could be one period or a multiple of the period of the A.C. mains supply. The pre-pulse train could have from 5 to 25 pulses, or more preferably 10 to 20, Ideally about 15 pulses In number. The gap between the pre-pulse train and the first measurement pulse is preferably no more than several periods of A.C. mains supply. There may be just one measurement pulse, or a short series of such pulses. This number, and the gap between sequences of measurement pulses, are determined by other functionality of the product, such as socket testing as mentioned above. Also, the number of different widths of measurement pulse could be two or three or more than three, the example given in FIG. 3 being advantageous in some applications.

Other means for switching the load resistance into the circuit are of course feasible, such as other types of transistor.

Further, it is envisaged that other forms of delivery of the impedance information could be provided, instead of visual indications. For example, the data could be read into a hand held device such as a computer, or the information could be provided aurally, by tones or voice synthesis.

Further, whilst in this example the circuit is "floating" and is self-contained in a convenient housing, the meter could be provided in any form, and could be integrated into other electrical apparatus.

The invention claimed is:

1. A loop impedance meter for testing an A.C. electrical mains supply, comprising an electronic control circuit for connecting a load resistance intermittently between the A.C. mains supply terminal and the earth terminal to measure the potential difference between those terminals and to provide an indication of the loop impedance of the A.C. mains supply from that potential difference, wherein the control circuit is arranged to allow a train of short pulses of current to flow through the load resistance and the loop, the pulse train beginning its sequence with a first train of pulses for preconditioning any residual circuit device present in the loop to temporarily desensitize it, wherein the first train of pulses is followed by one or more measurement pulses, the pulses of the first train being of generally increasing width.

2. A loop impedance meter according to claim 1, in which the pulses of the first train have widths less than 100 microseconds.

3. A loop impedance meter according to claim 1, in which the pulses of the first train have widths greater than 1 microsecond.

4. A loop impedance meter according to claim 1, in which the pulses of the first train have widths which increase steadily.

5. A loop impedance meter according to claim 1, in which the pulses of the first train increase with incremental values from pulse to pulse of between 1 and 10 microseconds.

6. A loop impedance meter according to claim 5, in which the increment is between 2 and 6 microseconds.

7. A loop impedance meter according to claim 6, in which the increment is about 4 microseconds.

8. A loop impedance meter according to claim 1, in which the pulse separation between the pulses of the first train is a period or a multiple of the period of the A.C. mains supply.

9. A loop impedance meter according to claim 1, in which the first pulse train has between 5 and 25 pulses.

10. A loop impedance meter according to claim 9, in which the first pulse train has between 10 and 20 pulses.

11. A loop impedance meter according to claim 9, in which the first pulse train has about 15 pulses.

12. A loop impedance meter according to claim 1, in which the interval between the first pulse train and the first measurement pulse is of at least several periods of the A.C. mains supply.

13. A loop impedance meter according to claim 1, in which the pulse train comprise a series of measurement pulses, and the control circuit is arranged to provide an average of the results of determining the loop impedance from each measurement pulse.

14. A loop impedance meter according to claim 1, in which the control circuit is arranged to supply several such pulses and to process the results of measuring the loop impedance so as to extrapolate to the effective impedance at the A.C. mains supply frequency.

15. A method of measuring the phase-to-earth loop impedance of an A.C. mains supply, comprising, connecting a loop impedance meter according to claim 1 across the supply and observing the indication of the loop impedance.

16. Apparatus for measuring the loop impedance of an A.C. electrical mains supply and for protecting loads on that supply from excessive current, comprising an RCD and a loop impedance meter according to claim 1, configured to minimize the risk of inadvertent tripping of the RCD whilst in use.

17. A loop impedance meter according to claim 1, in which the measurement pulse train is repeated at intervals.

18. A loop impedance meter according to claim 17, in which the intervals increase with time, to avoid overheating of the meter from the load resistance.

19. A loop impedance meter according to claim 1, which is self-contained with its own power supply derived from the A.C. mains being measured.

20. A loop impedance meter according to claim 1, in which the load resistance measured in ohms is in the range of one sixth to twice the r.m.s. mains voltage rating measured in volts of the meter, so as to deliver about ½ A to 6A intermitted current flow in pulses.

21. A loop impedance meter according to claim 1, in which the load resistance is of the order of 100 to 500 ohms.

22. A method of preconditioning an RCD incorporated in an A.C. electrical mains supply, to temporarily desensitize the RCD, the method comprising connecting a load resistance intermittently between the A.C. mains supply terminal and the earth terminal and thereby causing a sequence of short pulses of current of generally increasing width to flow between the mains supply terminal and the earth terminal, thereby preconditioning the RCD and temporarily desensitizing the RCD, wherein the sequence of short pulses is followed by one or more loop impedance measurement pulses.

* * * * *